(12) United States Patent
Hayashi et al.

(10) Patent No.: US 9,148,634 B2
(45) Date of Patent: Sep. 29, 2015

(54) IMAGING DEVICE, METHOD FOR CONTROLLING IMAGING DEVICE, AND STORAGE MEDIUM STORING A CONTROL PROGRAM WHERE A BASIC COLOR FILTER ARRAY PATTERN IS REPEATED TO REDUCE FALSE COLOR GENERATION WHEN IMAGE IS THINNED

(71) Applicant: FUJIFILM Corporation, Tokyo (JP)

(72) Inventors: Kenkichi Hayashi, Saitama (JP); Seiji Tanaka, Saitama (JP); Tomoyuki Kawai, Saitama (JP); Hidekazu Kurahashi, Saitama (JP); Noriko Kawamura, Saitama (JP); Hirofumi Horii, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/316,020

(22) Filed: Jun. 26, 2014

(65) Prior Publication Data

US 2014/0307138 A1 Oct. 16, 2014

Related U.S. Application Data

(63) Continuation of application No. PCT/JP2012/083974, filed on Dec. 27, 2012.

(30) Foreign Application Priority Data

Dec. 27, 2011 (JP) .................................. 2011-286690

(51) Int. Cl.
*H04N 9/083* (2006.01)
*H04N 9/30* (2006.01)
(Continued)

(52) U.S. Cl.
CPC ............... *H04N 9/30* (2013.01); *H04N 5/3456* (2013.01); *H04N 5/3458* (2013.01); *G06T 3/4015* (2013.01); *H01L 27/14621* (2013.01); *H04N 9/045* (2013.01); *H04N 2209/045* (2013.01)

(58) Field of Classification Search
CPC ............. H04N 9/045; H04N 2209/046; H01L 27/14621
See application file for complete search history.

(56) References Cited

U.S. PATENT DOCUMENTS

| 5,889,554 A | 3/1999 | Mutze |
| 6,995,796 B2 | 2/2006 | Taubman |

(Continued)

FOREIGN PATENT DOCUMENTS

| CN | 1317831 A | 10/2001 |
| CN | 1575027 A | 10/2005 |

(Continued)

OTHER PUBLICATIONS

International Search Report issued in PCT/JP2012/083974, dated Feb. 5, 2013.

(Continued)

*Primary Examiner* — Sinh Tran
*Assistant Examiner* — Shahbaz Nazrul
(74) *Attorney, Agent, or Firm* — Birch, Stewart, Kolasch & Birch, LLP

(57) ABSTRACT

In the present invention, effective thinned reading is performed when using an imaging device provided with a color filter other than a Bayer array. This imaging device (10) is provided with: an imaging element (14) containing a plurality of photoelectric conversion elements arrayed in a first and second direction; a color filter, wherein a basic array pattern resulting from a first and second filter being disposed in a predetermined pattern of N×M pixels and the first and second filter being disposed in a first and second direction is disposed repeatedly, and the first filter is disposed in a first-third direction in the color filter; a line image data generation means that, from the imaging element (14), reads the pixel signals of a plurality of pixels at a set cycle, and from the read pixel signals, generates line image data comprising pixel signals of pixels arrayed along the second direction and arrayed in an (N+k) line cycle in the first direction among the plurality of pixels; and an image data generation means that generates image data on the basis of the line image data.

10 Claims, 20 Drawing Sheets

(51) Int. Cl.
*H04N 5/345* (2011.01)
*G06T 3/40* (2006.01)
*H01L 27/146* (2006.01)
*H04N 9/04* (2006.01)

(56) References Cited

U.S. PATENT DOCUMENTS

| | | |
|---|---|---|
| 2001/0030700 A1 | 10/2001 | Mabuchi et al. |
| 2002/0149686 A1 | 10/2002 | Taubman |
| 2004/0109068 A1 | 6/2004 | Mitsunaga et al. |
| 2004/0169747 A1 | 9/2004 | Ono et al. |
| 2005/0270388 A1 | 12/2005 | Hamamoto |
| 2006/0119722 A1 | 6/2006 | Mabuchi et al. |
| 2006/0186322 A1* | 8/2006 | Matsuyama ............ 250/226 |
| 2006/0203113 A1 | 9/2006 | Wada et al. |
| 2006/0222269 A1* | 10/2006 | Ohno ..................... 382/300 |
| 2007/0096011 A1* | 5/2007 | Sato et al. ............. 250/208.1 |
| 2007/0153104 A1 | 7/2007 | Ellis-Monaghan et al. |
| 2008/0151083 A1* | 6/2008 | Hains et al. ............ 348/273 |
| 2008/0291304 A1 | 11/2008 | Ota et al. |
| 2009/0141154 A1* | 6/2009 | Mabuchi et al. ........ 348/302 |
| 2009/0200451 A1 | 8/2009 | Conners |
| 2010/0013948 A1 | 1/2010 | Azuma et al. |
| 2010/0194939 A1* | 8/2010 | Kera ..................... 348/273 |
| 2011/0069189 A1 | 3/2011 | Venkataraman et al. |
| 2012/0025060 A1 | 2/2012 | Iwata |
| 2012/0200750 A1 | 8/2012 | Mabuchi et al. |

FOREIGN PATENT DOCUMENTS

| | | |
|---|---|---|
| EP | 1148712 | 10/2001 |
| JP | H02-210996 | 8/1990 |
| JP | 8-23542 A | 1/1996 |
| JP | 8-23543 A | 1/1996 |
| JP | 11-285012 A | 10/1999 |
| JP | 2000-308080 A | 11/2000 |
| JP | 2002-135793 A | 5/2002 |
| JP | 2004-221839 A | 8/2004 |
| JP | 2004-266369 A | 9/2004 |
| JP | 2005-136765 A | 5/2005 |
| JP | 2005-136766 A | 5/2005 |
| JP | 2007-184904 A | 7/2007 |
| JP | 3960965 B2 | 8/2007 |
| JP | 2007-306490 A | 11/2007 |
| JP | 2008-236620 A | 10/2008 |
| JP | 2010-512048 A | 4/2010 |
| JP | 2011-523538 | 4/2010 |
| JP | 2010-153511 A | 7/2010 |
| JP | 2010-233241 A | 10/2010 |
| WO | WO 02/056604 A1 | 7/2002 |
| WO | WO 2008/066698 A2 | 6/2008 |
| WO | WO 2009/031287 A1 | 3/2009 |
| WO | WO 2009/151903 A2 | 12/2009 |

OTHER PUBLICATIONS

Office Action issued in Chinese Patent Application No. 201180022503.3 dated May 23, 2013.
Written Opinion of the International Searching Authority issued in PCT/JP2012/080898, dated Jan. 22, 2013.
Written Opinion of the International Searching Authority issued in PCT/JP2012/080899, dated Jan. 15, 2013.
Written Opinion of the International Searching Authority issued in PCT/JP2012/081644, dated Jan. 15,.2013.
Written Opinion of the International Searching Authority issued in PCT/JP2012/083583, dated Jan. 29, 2013.
Written Opinion of the International Searching Authority issued in PCT/JP2012/083974, dated Feb. 5, 2013.
Extended European Search Report dated Aug 4, 14 in EP Application No. 11859479.5.
Extended European Search Report dated Jan 27, 15 in EP Application No. 12804973.1.
Extended European Search Report dated Oct 28, 14 in EP Application No. 11859950.5.
Hirakawa et al. "Spatio Spectral Color Filter Array Design for Optimal Image Recovery" IEEE Transactions on Imge Processing 17:10:1876-1980 (Oct 2008).
European Search Report, dated Apr. 9, 2015, in related application No. EP12861999.
Chinese Office Action, dated Dec. 31, 2014, In related application No. CN201260064714.8.

* cited by examiner

FIG.4

|   |   |   | A ARRAY | | | B ARRAY | | |
|---|---|---|---|---|---|---|---|---|
| G | B | G | G | R | G | G | B | G |
| R | G | R | B | G | B | R | G | R |
| G | B | G | G | R | G | G | B | G |
| G | R | G | G | B | G | G | R | G |
| B | G | B | R | G | R | B | G | B |
| G | R | G | G | B | G | G | R | G |
| G | B | G | G | R | G | G | B | G |
| R | G | R | B | G | B | R | G | R |
| G | B | G | G | R | G | G | B | G |

| R | B | G | R | B | R | E | B | R | B | G | R | B | R | E | B |
|---|---|---|---|---|---|---|---|---|---|---|---|---|---|---|---|
| G | G | G | B | E | G | G | R | G | G | G | B | E | G | G | R |
| B | G | G | G | R | G | G | E | B | G | G | G | R | G | G | E |
| R | G | B | R | B | E | R | B | R | G | B | R | B | E | R | B |
| B | R | E | B | R | B | G | R | B | R | E | B | R | B | G | R |
| E | G | G | R | G | G | G | B | E | G | G | R | G | G | G | B |
| R | G | G | E | B | G | G | G | R | G | G | E | B | G | G | G |
| B | E | R | B | R | G | B | R | B | E | R | B | R | G | B | R |
| R | B | G | R | B | R | E | B | R | B | G | R | B | R | E | B |
| G | G | G | B | E | G | G | R | G | G | G | B | E | G | G | R |
| B | G | G | G | R | G | G | E | B | G | G | G | R | G | G | E |
| R | G | B | R | B | E | R | B | R | G | B | R | B | E | R | B |
| B | R | E | B | R | B | G | R | B | R | E | B | R | B | G | R |
| E | G | G | R | G | G | G | B | E | G | G | R | G | G | G | B |
| R | G | G | E | B | G | G | G | R | G | G | E | B | G | G | G |
| B | E | R | B | R | G | B | R | B | E | R | B | R | G | B | R |

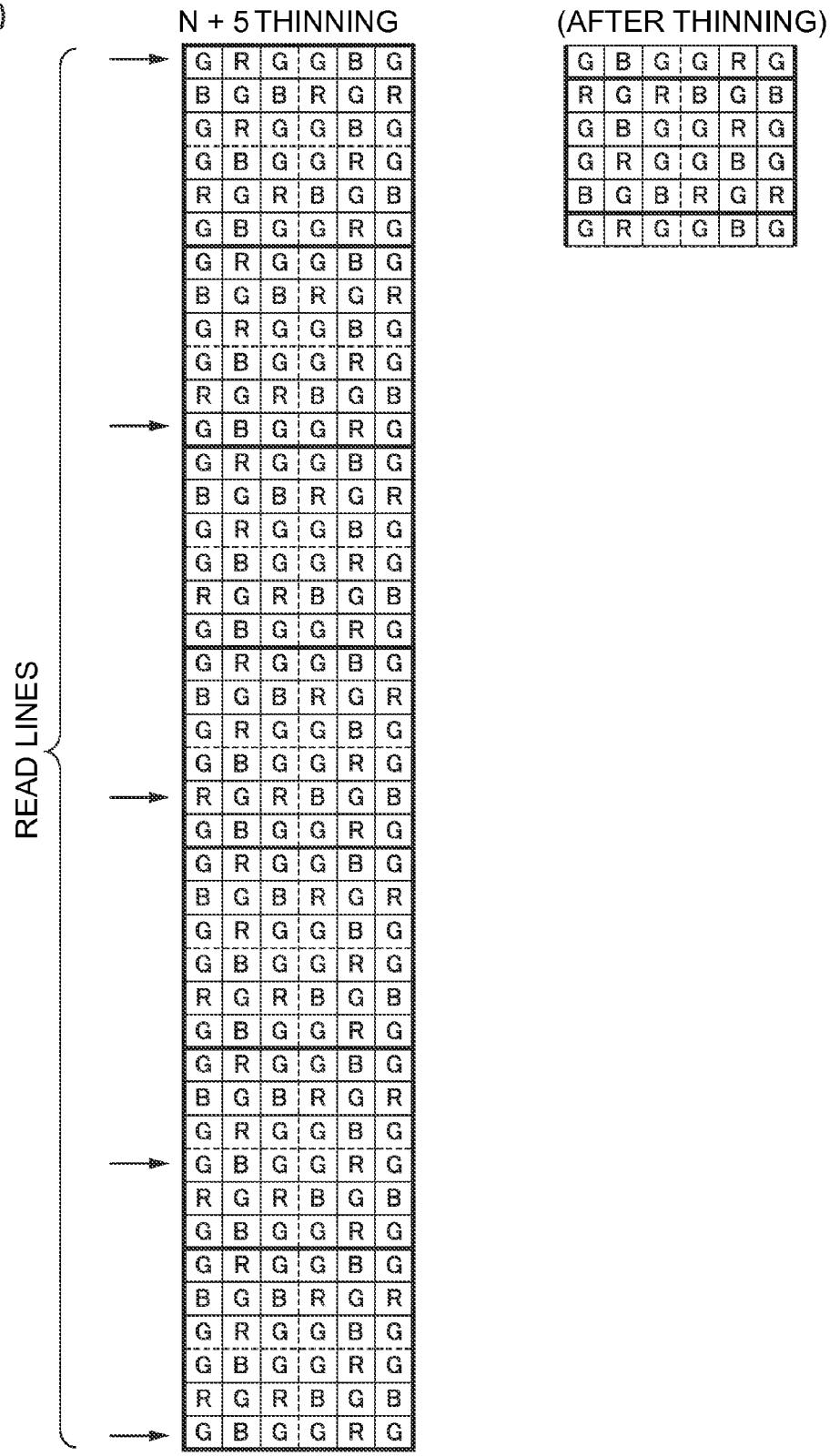

IMAGING DEVICE, METHOD FOR CONTROLLING IMAGING DEVICE, AND STORAGE MEDIUM STORING A CONTROL PROGRAM WHERE A BASIC COLOR FILTER ARRAY PATTERN IS REPEATED TO REDUCE FALSE COLOR GENERATION WHEN IMAGE IS THINNED

CROSS-REFERENCE TO RELATED APPLICATIONS

This application is a continuation application of International Application No. PCT/JP2012/083974, tiled Dec. 27, 2012, the disclosure of which is incorporated herein by reference in its entirety. Further, this application claims priority from Japanese Patent Application No. 2011-286690, filed Dec. 27, 2011.

BACKGROUND

1. Technical Field

The present invention relates to an imaging apparatus, and a control method and a control program for an imaging apparatus, and in particular to an imaging apparatus equipped with a color image pickup device, and a control method and control program for an imaging apparatus of the same.

2. Related Art

A primary color system Bayer array (see, for example, Patent Documents 1 to 3), this being a color array widely employed in color image pickup devices, has red (R) and blue (B) placed in sequential lines of a chessboard pattern of green (G) pixels, to which the human eye is most sensitive and that contribute most to obtaining a brightness signal.

Patent Document 1: Japanese Patent Application Laid-Open (JP-A) No. 2002-135793
Patent Document 2: Japanese Patent No. 3960965
Patent Document 3: JP-A No. 2004-266369

TECHNICAL PROBLEM

However, in a. color image pickup device that employs a conventional Bayer array, for example in cases in which thinned reading is performed in the vertical direction in order to generate image data for video use, in situations where for example one line's worth of image data has been read for each 2n lines (wherein n is a positive integer) in the vertical direction (vertical direction 1/2n thinning, even number thinning), this results in line image data being read that only contains two colors: G and R, or G and B, and so color reproduction is not possible. Therefore, in thinned reading, generally one lines worth of image data is read for each (2n+1) lines (vertical direction 1/(2n+1) thinning, odd number thinning). Moreover, in other cases in which thinned reading is performed, in order to obtain color reproduction, horizontal lines containing G and R, and horizontal lines containing G and B need to be read alternately, placing severe limitations on reading methods.

Moreover, in a Bayer array, there is a problem with reproduction precision when generating high frequency signals in diagonal directions for G signals, and in the horizontal direction and the vertical direction for R and B signals, there is a problem of an inability to suppress generation of color moiré (false color) for high frequency signals, and when thinned reading is performed as described above, since the same color array results as that of the original Bayer array, the same problems occur.

SUMMARY

The present invention has been configured to solve the above problems, and an object thereof is to provide an imaging apparatus, and a control method and a control program for an imaging apparatus, that enable efficient thinned reading to be performed when an image pickup device is equipped with a color filter employing an array other than a Bayer array.

Solution to Problem

In order to solve the above problems, an imaging apparatus of the present invention includes: an image pickup device including plural photoelectric conversion elements arrayed in a predetermined first direction and a second direction intersecting with the first direction; a color filter that is provided above plural pixels configured by the plural photoelectric conversion elements, the color filter having a repeatedly disposed basic array pattern in which a first filter corresponding to a first color that contributes most to obtaining a brightness signal, and second filters respectively corresponding to 2 or more second colors other than the first color, are placed in a predetermined pattern of (N×M) pixels in the first direction and the second direction (in which N and M are integers of 3 or more), with one or more of the first filter and the second filters corresponding to each of the second colors respectively placed in each line in the color filter in the first direction and the second direction, and with one or more of the first filter placed in each line in the color filter plane in the first direction, the second direction and third directions that intersect with the first direction and the second direction, a line image data generation section that reads pixel signals from plural pixels at a set cycle from the image pickup device, and, from the read pixel signals, generates line image data configured from pixel signals of pixels that are arrayed running along the second direction and are arrayed at an (N+k) line cycle in the first direction (in which k is a positive integer such that 0<k<N) from out of the plural pixels; and an image data generation section that generates image data based on the line image data.

According to the invention, line image data configured from pixel signals of pixels that are arrayed at an (N+k) cycle in the first direction (in which k is a positive integer such that 0<k<N) and that are arrayed running along the second direction, from the image pickup device, in an array other than a Bayer array, is generated, and degrees of freedom for the configuration are thus obtained.

Note that the line image data generation section may generate line image data configured from pixel signals of pixels that are arrayed running along the second direction and are arrayed at an (N+k) line cycle in the first direction such that at least one of the first color and each of the second colors of the two or more colors are respectively contained in each of the lines running along the first direction.

According to the invention, line image data is generated such that at least one of the first color and each of the second colors of the two or more colors are respectively contained in each of the lines running along the first direction, and a reduction in the generation of false color is thus enabled.

Moreover, the line image data generation section may generate line image data configured from pixel signals of pixels that are arrayed running along the second direction and are arrayed, as the set cycle, at an (N+1) line cycle in the first direction.

According to the invention, the image after thinning also is an image in which the basic array pattern is repeated, similarly to before thinning, enabling processing to be applied that is common to the image processing of non-thinned image data, such as in still image capture.

Moreover, configuration may be made so as to further include: a pixel mixing section that respectively mixes pixels that are the same color pixels as each other from the line image data configured from the pixel signals of the pixels that are arrayed running along the second direction and are arrayed at the (N+k) line cycle in the first direction, and from line image data configured from pixel signals of pixels that are arrayed running along the second direction and are arrayed at an N line cycle in the first direction away from the (N+k) line image data.

According to the invention, the pixel mixing section respectively mixes pixels that are the same color pixels as each other from the line image data configured from the pixel signals of the pixels that are arrayed running along the second direction and are arrayed at the (N+k) line cycle in the first direction, and from line image data configured from pixel signals of pixels that are arrayed running along the second direction and are arrayed at the N line cycle in the first direction away from the (N+k) line image data, thus an improvement in the S/N ratio of the image is enabled compared to cases in which there is no pixel mixing.

Moreover, the imaging apparatus may be configured further including: a switching section that switches between a first generation method that generates line image data configured from pixel signals of pixels that are arrayed running along the second direction and are arrayed at an (N+k) line cycle in the first direction (in which 0<k<N), and a second generation method that generates line image data configured from pixel signals of pixels that are arrayed running along the second direction and are arrayed at an (N−k) line cycle in the first direction.

Configuration may be made such that the color filter includes a square array corresponding to 2×2 pixels configured from the first filter.

According to the invention, which direction, out of each of the four directions, is the brightness correlation direction can be determined by determination of the minimum pixel separation based on difference values of pixel values between each of the pixels of the 4 pixels of the square array corresponding to the 2×2 pixels.

Configuration may be made such that the first color is green (G), and the second colors are red (R) and blue (B).

Moreover, configuration may be made such that: the color filter includes an R filter, a G filter, and a B filter corresponding to colors red (R), green (G) and blue (B); and the color filter is configured by a first array and a second array alternately arrayed in the first direction and the second direction, in which the first array corresponds to 3×3 pixels with the G filter placed at the center and the 4 corners, the B filter placed at the top and bottom of the central G filter, and the R filter placed at the left and right of the central G filter, and the second array corresponds to 3×3 pixels with the G filter placed at the center and the 4 corners, the R filter placed at the top and bottom of the central G filter, and the B filter placed at the left and right of the central G filter.

According to the invention, if 5×5 pixels (a local region of a mosaic image) are extracted centered on the fiat array or the second array there is a G pixel present in adjacent contact on either side in the horizontal direction and the vertical direction of the central pixel (the R pixel or the B pixel) of the 5×5 pixels. The pixel values of these G pixels (a total of 8 pixels) can be employed to determine the correlation direction out of 4 directions.

An imaging apparatus control method of the present invention is a control method for an imaging apparatus, executed by an imaging apparatus including an image pickup device including plural photoelectric conversion elements arrayed in a predetermined first direction and a second direction intersecting with the first direction, and a color filter that is provided above plural pixels configured by the plural photoelectric conversion elements, the color filter having a repeatedly disposed basic array pattern in which a first filter corresponding to a first color that contributes most to obtaining a brightness signal, and second filters respectively corresponding to 2 or more second colors other than the first color, are placed in a predetermined pattern of (N×M) pixels in the first direction and the second direction (in which N and M are integers of 3 or more), with one or more of the first filter and the second filters corresponding to each of the second colors respectively placed in each line in the color filter in the first direction and the second direction, and with one or more of the first filter placed in each line in the color filter plane in the first direction, the second direction and third directions that intersect with the first direction and the second direction. The control method including: reading pixel signals from plural pixels at a set cycle from the image pickup device; generating, from the read pixel signals, line image data configured from pixel signals of pixels that are arrayed running along the second direction and are arrayed at an (N+k) line cycle in the first direction (in which k is a positive integer such that 0<k<N; from out of the plural pixels; and generating image data based on the line image data, A control program of the present invention is a control program that causes processing to be executed by a computer that controls an imaging apparatus including an image pickup device including plural photoelectric conversion elements arrayed in a predetermined first direction and a second direction intersecting with the first direction, and a color filter that is provided above plural pixels configured by the plural photoelectric conversion elements, the color filter having a repeatedly disposed basic array pattern in which a first filter corresponding to a first color that contributes most to obtaining a brightness signal, and second filters respectively corresponding to 2 or more second colors other than the first color, are placed in a predetermined pattern of (N×M) pixels in the first direction and the second direction (in which N and M are integers of 3 or more), with one or more of the first filter and the second filters corresponding to each of the second colors respectively placed in each line in the color filter in the first direction and the second direction, and with one or more of the first filter placed in each line in the color filter plane in the first direction, the second direction and third directions that intersect with the first direction and the second direction. The processing including: a step of reading pixel signals from plural pixels at a set cycle from the image pickup device; a step of generating, from the read pixel signals, line image data configured from pixel signals of pixels that are arrayed running along the second direction and are arrayed at an (N+k) line cycle in the first direction (in which k is a positive integer such that 0<k <N) from out of the plural pixels; and a step of generating image data based on the line image data.

A control program of the present invention is a control program that causes processing to be executed by a computer, the processing including: a step of for pixel signals of pixel signals in plural pixels read at a set cycle from an image pickup device including plural photoelectric conversion elements arrayed in a predetermined first direction and a second direction intersecting with the first direction, and a color filter that is provided above plural pixels configured by the plural photoelectric conversion elements, the color filter having a repeatedly disposed basic array pattern in which a first filter corresponding to a first color that contributes most to obtaining a brightness signal, and second filters respectively corresponding to 2 or more second colors other than the first color, are placed in a predetermined pattern of (N×M) pixels in the first direction and the second direction (in which N and M are integers of 3 or more), with one or more of the first filter and the second filters corresponding to each of the second colors respectively placed in each line in the color filter in the first direction and the second direction, and with one or more of the first filter placed in each line in the color filter plane in the first direction, the second direction and third directions that intersect with the first direction and the second direction, with the line image data configured from pixel signals of pixels that are arrayed running along the second direction and are arrayed at a cycle of (N+k) in the first direction (in which k is a positive integer such that 0<k<N) from out of the plural pixels; and a step of generating image data based on the line image data.

Advantageous Effects of Invention

According to the invention an advantageous effect is exhibited of enabling a reduction in the generation of false color in cases in which thinned image data is read.

BRIEF DESCRIPTION OF DRAWINGS

FIG. 4 is a diagram illustrating a color filter in which 6×6 pixel basic array patterns contained in a color filter according to the first exemplary embodiment are split into 3×3 pixel A arrays and B arrays that are repeatedly disposed along a horizontal direction and a vertical direction.

FIG. 9 is an explanatory diagram regarding switching of lines to be read according to a third exemplary embodiment.

FIG. 16 is a diagram of a modified example of a color filter.

FIG. 20 is an explanatory diagram regarding an image in a case in which one line's worth of image data is read for each (N+5) lines.

DESCRIPTION OF EMBODIMENTS

Explanation follows regarding exemplary embodiments of the present invention, with reference to the drawings.

First Exemplary Embodiment

Figure 1:
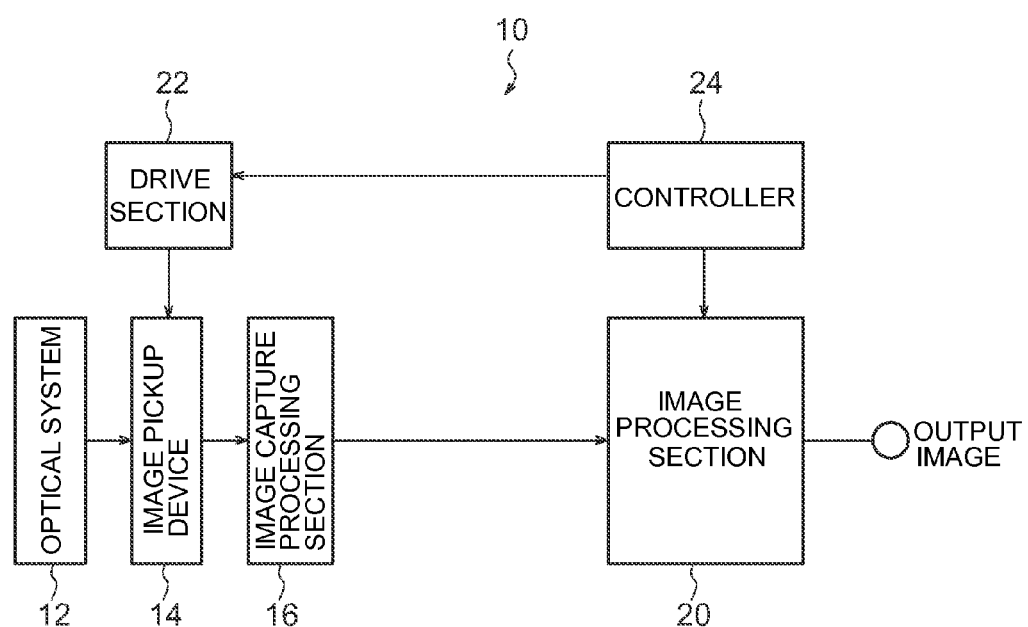
FIG. 1 is a schematic block diagram of an imaging apparatus according to a first exemplary embodiment.

FIG. 1 is a schematic block diagram illustrating an imaging apparatus 10 according to the present exemplary embodiment. The imaging apparatus 10 is configured including an optical system 12, an image pickup device 14, an image capture processing section 16, an age processing section 20, a drive section 22, and a controller 24.

The optical system 12 is configured including, for example, a lens set configured from plural optical lenses, an aperture adjustment mechanism, a zoom mechanism, and an automatic focusing mechanism.

The image pickup device 14 is what is referred to as a 1-chip image pickup device configured by an image pickup device, such as for example a Charge Coupled Device (CCD) or a Complementary Metal Oxide Semiconductor (CMOS), containing plural photoelectric conversion elements arrayed in the horizontal direction and vertical direction, with a color filter disposed above the image pickup device.

Figure 2:
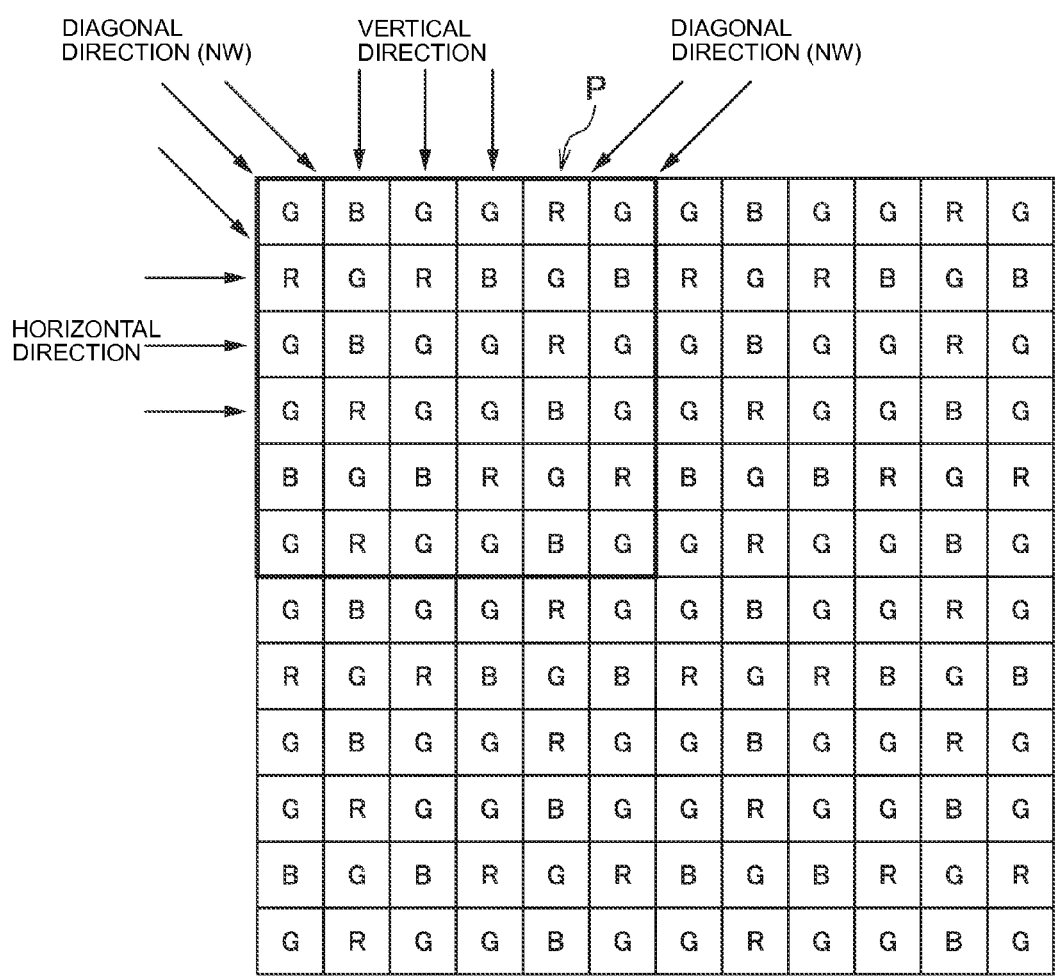
FIG. 2 is a configuration diagram of a color filter according to the first exemplary embodiment.

FIG. 2 illustrates a portion of a color filter according to the present exemplary embodiment. One out of 3 primary color filters red (R), green (C) and blue (B) is placed over each of the pixels.

Color Filter Array Features

The color filter of the first exemplary embodiment includes the following features (1) to (6).

Feature (1)

The color filter array has a repeatedly disposed basic array pattern of a predetermined pattern of (N×M) pixels (wherein N, M are integers of 3 or more) in the vertical direction and the horizontal direction of the 3 primary color filters red (R), green (C) and blue (B), wherein the green (G) filter and at least one color filter out of the red (R) or the blue (B) is placed in each of the vertical direction and the horizontal direction.

The color filter according to the present exemplary embodiment illustrated in FIG. 2 includes a basic array pattern P (the pattern indicated by the bold frame) formed from square array patterns corresponding to, as an example, 6×6 pixels (N=M=6), with the basic array pattern P disposed so as to repeat in both the vertical direction (a first direction) and the horizontal direction (a second direction). Namely, the color filler is arrayed such that the respective filters of each color R, G, B (the R filters, G filters, B filters) have a specific periodicity.

Thus arraying the R filters, G filters and B filters with a specific periodicity enables processing to be performed in a repeating pattern during, for example, synchronization processing (also referred to as demosaic processing, the same applies below) of R, G, B signals read from the color image pickup device.

Feature (2)

The color filter array illustrated in FIG. 2 has the G filter, that corresponds to the color contributing the most to obtaining a brightness signal (the color G in the present exemplary embodiment) placed in each line in the color filter array in the vertical direction that is the first direction, the horizontal direction that is the second direction, and third directions in the color filter plane that intersects with the first direction and the second direction, namely diagonal directions (NE, NW) (third directions). Note that NE means a diagonal direction toward the top right, and NW means a diagonal direction toward the bottom right. For example, for a square pixel array, the diagonal top right direction and the diagonal bottom right direction are directions at 45° with respect to the horizontal direction. However, in a rectangular pixel array, these are the directions of the pair of diagonals of a rectangle, and their angle varies according to the lengths of the long sides and the short sides.

Placing the G filters corresponding to the brightness system pixels in each of the lines in the vertical direction, horizontal direction, and diagonal directions (NE, NW) of the color filter array, enables the reproduction precision of synchronization processing to be raised in high frequency regions, irrespective of the directionality of the high frequency.

Feature (3)

In the color filter array illustrated in FIG. 2, 1 or more of each of the R filter and the B filter, corresponding to the 2 or more colors other than the above color G (colors R, B in the present exemplary embodiment), is disposed in each line in the basic array pattern P in the vertical direction and horizontal direction of the color filter array.

Disposing the R filter and the B filter in each line in the vertical direction and horizontal direction of the color filter array enables generation of color moiré (false color) to be reduced.

This thereby enables an optical low pass filter for suppressing false color generation to be omitted from placement on the optical path of the optical system, from the incident face to the imaging plane, or, even in cases in which an optical low pass filter is applied, one can be employed that has a weak action to cut the high frequency components to prevent false color generation, thereby enabling deterioration of resolution to be avoided.

Feature (4)

Figure 3:
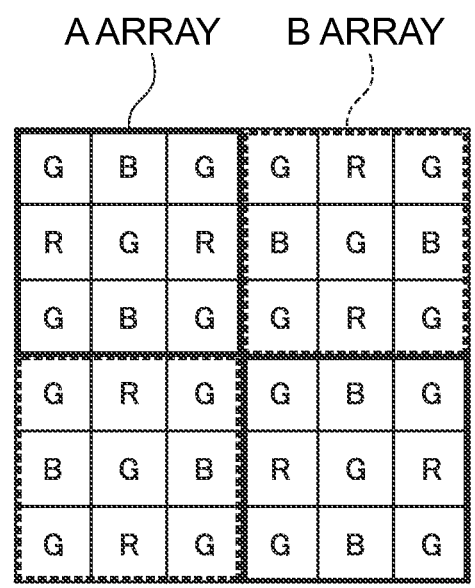
FIG. 3 is a diagram illustrating basic array pattern contained in a color filter according to the first exemplary embodiment.

FIG. 3 illustrates a state in which the basic array pattern P illustrated in FIG. 2 has been divided into 4 sets of 3×3 pixels.

The basic array pattern P, as illustrated in FIG. 3, may be achieved by arraying an A array of the 3×3 pixels surrounded by the solid line frame, and a B array of the 3×3 pixels surrounded by the broken line frame, so as to be alternately disposed along the horizontal and vertical directions.

In both the A array and the B array, the G filters that are the brightness system pixels are placed at the 4 corners and at the center, thereby being placed over both diagonal lines. in the A array, R filters are placed on both sides of the central G filter in the horizontal direction, and B filters are placed on both sides of the central G filter in the vertical direction. However in the B array, B filters are placed on both sides of the central G filter in the horizontal direction, and R filters are placed on both sides of the central G filter in the vertical direction. Namely the A array and the B array have reverse positional relationships for the R filters and the B filters, but have similar placement otherwise.

Due to disposing the A array and the B array alternately in the vertical direction and the horizontal direction, as illustrated in FIG. 4, the 4 corner G filters in the A array and the B array form square array G fillers corresponding to 2×2 pixels.

Namely, the color filter array (basic array pattern P) illustrated in FIG. 2 includes square arrays corresponding to 2×2 pixels configured by G filters.

Figure 5:
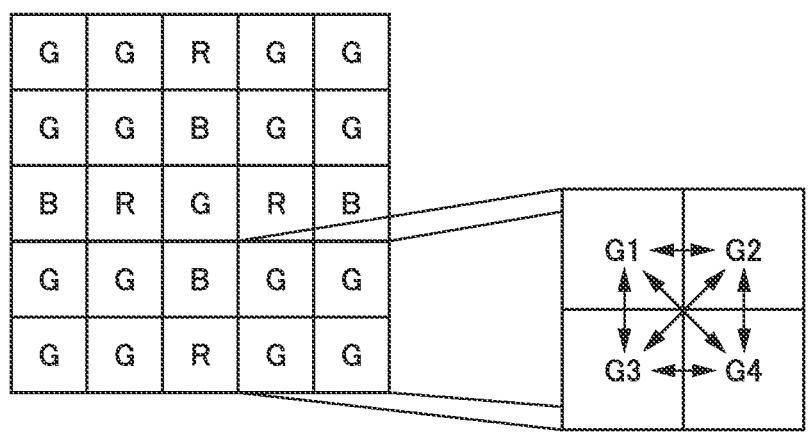
FIG. 5 is a diagram illustrating a distinctive placement of G pixels in a color filter according to a first exemplary embodiment.

When, as illustrated in FIG. 5, a 5×5 pixel local region centered on an A array is extracted from a mosaic image output from the image pickup device 14, the 2×2 pixels of G pixels at the 4 corners in the local region are disposed as illustrated in FIG. 5.

As illustrated in FIG. 5, taking the pixel values of the 2×2 pixels of pixels as G1, G2, G3, G4 in sequence from top left to bottom right, the vertical direction difference absolute value of the pixel values of these G pixels is (|G1−G3|+|G2−G4|)/2, the difference absolute value in the horizontal direction is (|G1−G2|+|G3−G4|)/2, the difference absolute value in the diagonal direction towards the top right is |G2−G3| and the difference absolute value in the diagonal direction towards the top left is |G1−G4|.

The correlation (correlation direction) can then be determined as the direction with the smallest difference absolute value out of these four correlation absolute values.

As illustrated in FIG. 4 or FIG. 5, when 5×5 pixel local region is extracted from a mosaic image such that the 3×3 pixel A array is positioned at its center, there are 2×2 pixels of G pixels placed at the 4 corners thereof Consequently, when the 3×3 pixels of the A array inside the above local region are pixels subject to synchronization processing, the sums (or the average values) of the correlation absolute values of the 4 corners are derived separately for each direction, and the direction having the smallest value out of the sums (or the average values) of the correlation absolute values for each direction is determined as the brightness correlation direction of the pixels subject to synchronization processing. The determined correlation direction may be employed when performing synchronization processing or the like.

Feature (5)

Moreover, the basic array pattern P configuring the color filter array illustrated in FIG. 2 has point symmetry about the center of the basic array pattern (the center of the 4 G filters). Moreover, as illustrated in FIG. 3, each of the A array and the B array inside the basic array pattern also respectively have point symmetry about the central G filters, and also have top-bottom and left-right symmetry (line symmetry).

This symmetry enables the circuit scale of a processing circuit at a later stage to be made smaller, and to be simplified.

The image capture processing section 16 performs predetermined processing on image capture signals output from the image pickup device 14, such as amplification processing, correlation double sampling processing and A/D conversion processing, and then outputs these as image data to the image processing section 20.

The image processing section 20 subjects the image data output from the image capture processing section 16 to what is referred to as synchronization processing. Namely, for all the pixels, interpolation is performed of image data for colors other than the corresponding respective color from pixel data of peripheral pixels, so as to generate R, G, B image data for all pixels. Then, what is referred to as YC conversion processing is performed to the generated R, G, B image data, to generate brightness data Y and color difference data Cr, Cb. Resizing processing is then performed to re-size these signals to a size according to the image capture mode.

The drive section 22 drives the image pickup device 14 according to instruction from the controller 24.

The controller 24 performs overall control, such as of the drive section 22 and the image processing section 20, according to such factors as the image capture mode. Detailed description is given later, however, briefly, the controller 24 instructs the drive section 22 to output image capture signals from the image pickup device 14 to the image capture processing section 16 with a method according to the image capture mode, and instructs the image processing section 20 to perform image processing according to the image capture mode.

Since, depending on the image capture mode, there is a need to thin and read the image capture signals from the image pickup device 14, the controller 24 instructs the drive section 22 so as to thin with a thinning method according to the instructed image capture mode and to output image capture signals from the image pickup device 14 to the image capture processing section 16.

As the image capture mode, there is a still image mode that captures a still image, and video modes, including an HD video mode that thins a captured image and generates High Definition (HD) video data at a comparatively high resolution and records this on a recording medium such as a memory card, not illustrated in the drawings, and a through video mode (live-view mode) in which a captured image is thinned and a through video (live-view image) of comparatively low resolution is output to a display section, not illustrated in the drawings. However, the type of image capture mode is not limited thereto.

Figure 7:
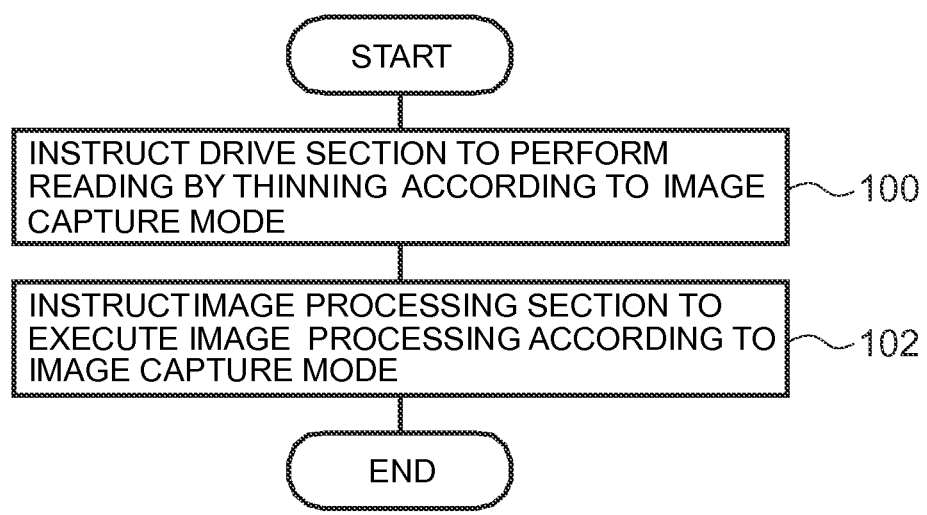
FIG. 7 is a flow chart illustrating processing executed by a control section.

Explanation next follows regarding processing executed by the controller 24 as operation of the present exemplary embodiment, with reference to the flow chart illustrated in FIG. 7.

Note that the processing illustrated in FIG. 7 is executed in cases in which instruction is given to execute image capture according to the image capture mode. The following explanation describes a case in which line image data is read at a predetermined cycle in the vertical direction, namely a case in which reading is performed in which lines other than lines of the predetermined cycle in the vertical direction are thinned (left out). The line image data in this case is a collection of pixel data of pixels in a row running along the horizontal direction.

First, at step 100, the drive section 22 is instructed to output image data from the image pickup device 14 to the image capture processing section 16 using a thinning method corresponding to the image capture mode.

In the present exemplary embodiment, the drive section 22 is instructed to output line image data from the image pickup device 14 to the image capture processing section 16 of lines running along the horizontal direction at a (N+k) line cycle in the vertical direction (wherein 0<k<N). Namely, the drive section 22 is instructed to output line image data from the image pickup device 14 to the image capture processing section 16 of lines running along the horizontal direction at a pixel cycle that is the pixel cycle in the vertical direction of the basic array pattern P or greater (in the present exemplary embodiment, the image pickup device 14, the drive section 22 and the controller 24 data correspond to the line image data generation means).

In cases where line image data of a line running along the horizontal direction has been read at a vertical direction (N+1) line cycle from the image pickup device 14, the image after thinning of the basic array pattern P that configures the color filter array illustrated in FIG. 2 becomes an image in which the basic array pattern P is repeated.

Figure 6:
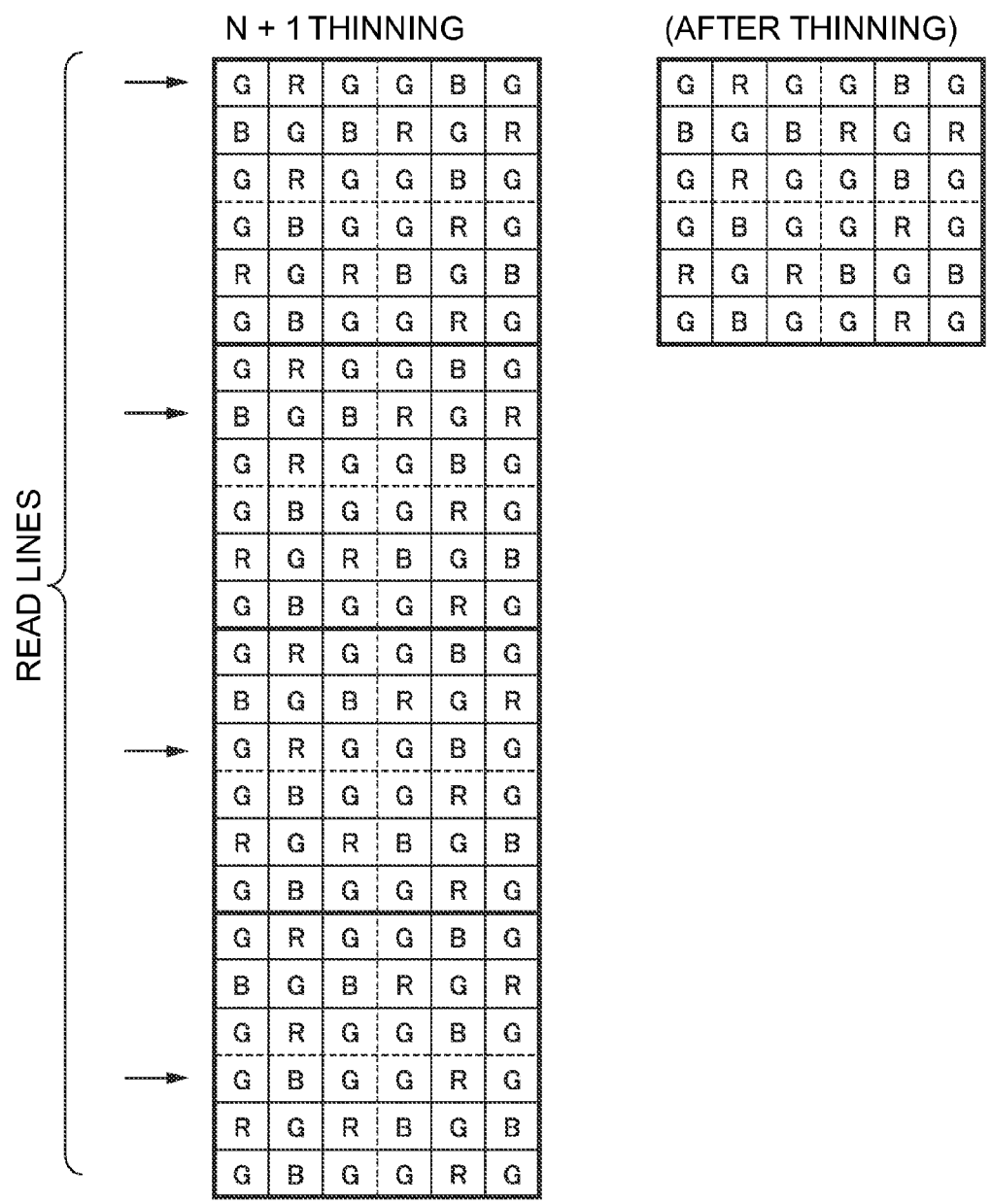
FIG. 6 is an explanatory diagram regarding an image in a case in which one line's worth of image data is read for each (N+1) lines in the vertical direction.

Since the basic array pattern of the color filter in FIG. 2 is 6×6 pixels, by reading line image data at a 7 line cycle in the vertical direction as indicated by the arrow in FIG. 6 (vertical direction 1/7 thinning), the image after thinning becomes an image in which the basic array pattern P is repeated.

Namely, if the vertical direction lines of the basic array pattern P are designated as lines 1 to 6, from the top, when the sequence when reading at a vertical direction 7 line cycle is the sequence 1, 2, 3, 4, 5, 6, 1, 2, 3, 4, 5, 6, and so on. Therefore, the image after thinning also repeats the vertical direction lines 1 to 6 of the basic array pattern P, and is an image in which the same basic array pattern as before thinning is repeated.

Consequently, the drive section 22 is instructed to output the line image data from the image pickup device 14 to the image capture processing section 16 for only lines running along the horizontal direction that are at a vertical direction 7 line cycle. One line's worth of image data is accordingly read for every 7 lines in the vertical direction, and the resulting image is an image in which the basic array pattern P is repealed, At step 102, the image processing section 20 is instructed to execute image processing according to the image capture mode (such as synchronization processing, YC conversion processing, or resizing processing) on the image data that has been thinned and read (in the present exemplary embodiment, the image processing section 20 and the controller 24 correspond to image data generation means).

Note that the controller 24 and the image processing section 20 may be configured by a computer including a CPU, RUM, RAM and non-volatile ROM. In such cases, the processing program for the above processing may, for example, be pre-stored on the non-volatile ROM, and may be executed by reading by the CPU.

Thus in the present exemplary embodiment, since line image data of a line running along the horizontal direction is read at a vertical direction (N+1) line cycle, the image after thinning is also an image in Which the same basic array pattern as before thinning is repeated.

Consequently, image processing can be made common to that for non-thinned image data, such as that for still image capture.

Note that since a G filter, an R filter, and a B filter, are placed in each of the vertical direction and the horizontal direction, a G filter, an R filter, and a B filter are still included in each of the read line image data even when read at an (N+k) line cycle.

There are accordingly no instances in which the read line image data is read as line image data that includes only two colors G and R, G and B, such as occurs in the conventional case of 1/2 thinning with a Bayer array, and color reproduction is enabled whichever line image data is read.

Second Exemplary Embodiment

Explanation next follows regarding a second exemplary embodiment of the present invention. In the present exemplary embodiment, explanation follows regarding a case of pixel mixing (for example pixel summing) with line image data read at a predetermined cycle in the vertical direction, and line image data read with the same array to that of the line image data that was read.

In the present exemplary embodiment, at step 100 of FIG. 7, the controller 24 instructs the drive section 22 to output line image data from the image pickup device 14 to the image capture processing section 16 for lines running along the horizontal direction at a (N+k) line cycle in the vertical direction (wherein 0<k<N), and to read the line image data read from lines running along the horizontal direction at a vertical direction N line cycle away from the image data read at the (N+k) line cycle line.

Moreover, at step 102 of FIG. 7, the controller 24 instructs the image processing section 20 to execute image processing to mix respective pixels that are the same color as each other in the read line image data running along the horizontal direction at the (N+k) cycle in the vertical direction, and in the read line image data along the horizontal direction at the vertical direction N line cycle away from the line image data read at the (N+k) cycle (the controller 24, the drive section 22, the image capture processing section 16, and the image processing section 20 correspond to the pixel mixing means). Alternatively, pixel mixing may occur in the image pickup device 14 (in this case, the controller 24, the drive section 22, the image pickup device 14, and the image capture processing section 16 correspond to the pixel mixing means).

Figure 8:
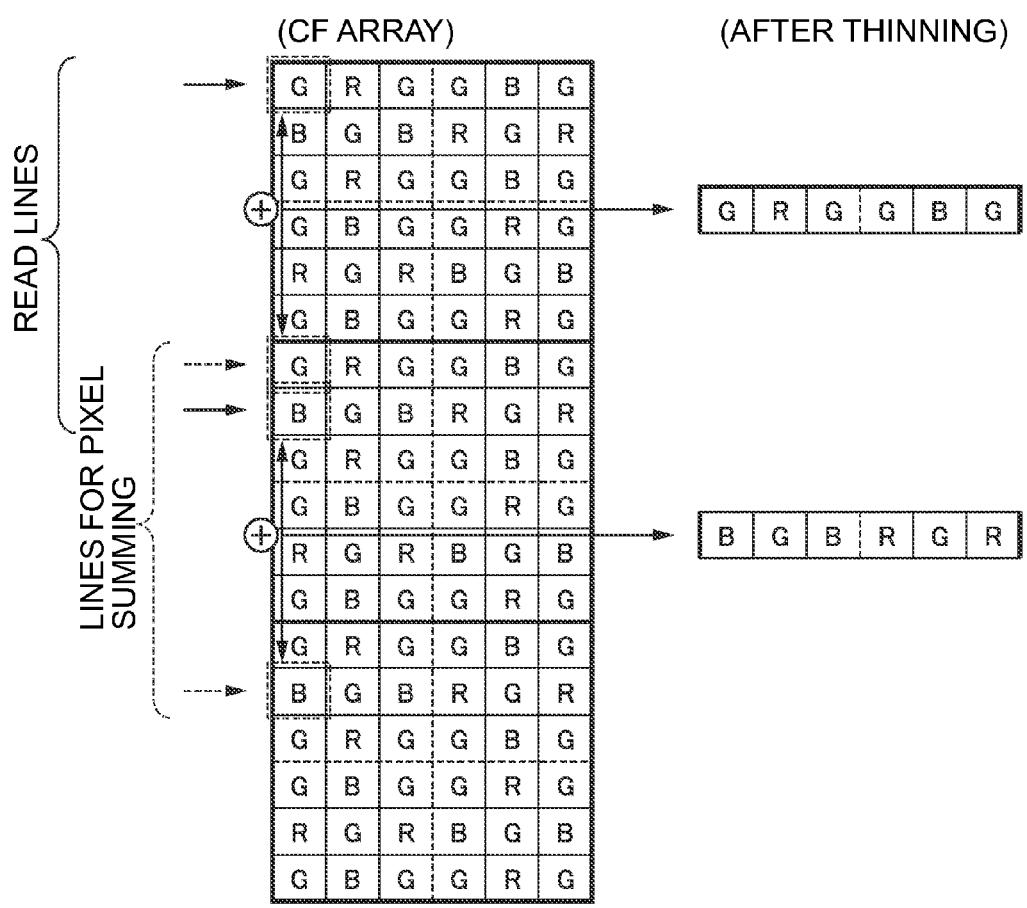
FIG. 8 is an explanatory diagram regarding pixel summing processing according to a second exemplary embodiment.

In FIG. 8, in a color filter in which the 6×6 pixel basic array pattern P is repeatedly disposed, line image data is read at a (N+1) line cycle in the vertical direction, namely line image data is read at a 7 line cycle as indicated by the solid line arrow in FIG. 8 (vertical direction 1/7 thinning), and also read at N line cycle in the vertical direction away from the line image data read at the 7 line cycle. Namely; a case is illustrated in which line image data read at a 6 line cycle is read as indicated by the dotted arrow in FIG. 8, and respective pixels that are the same color as each other therein are pixel summed.

As illustrated in FIG. 8, the array of line image data read at a 7 line cycle matches another array of line image data 6 lines previous to the given line image data.

Thus by summing pixels that are the same color as each other in the line image data read at the 7 line cycle, and in the line image data of the same array that is 6 lines ahead in the vertical direction from these line image data, namely pixels that are at the same position as each other in the horizontal direction therein, the S/N ratio of the image can be improved in comparison to cases in which pixel summing is not performed.

Note that although explanation has been given in the present exemplary embodiment of an example in which pixel values are simply summed for the same color of the line image data in the same arrays, there is no limitation thereto, and weighted summation may be performed.

Third Exemplary Embodiment

Explanation next follows regarding a third exemplary embodiment of the present invention. In the present exemplary embodiment, the lines for reading are switchable according to the image capture mode, namely explanation follows regarding cases in which the thinning method is switchable.

Figure 9:
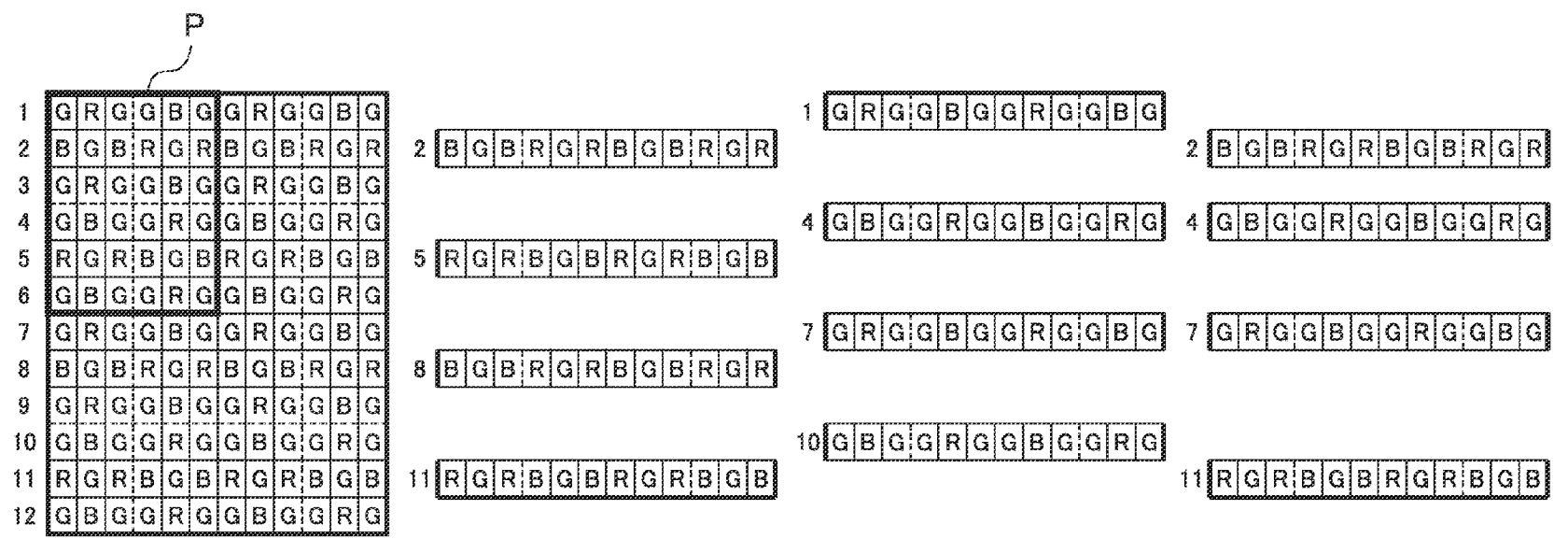

For a color filter in which the 6×6 pixel basic array pattern P illustrated in FIG. 9 is repeated, the line image data of the $2^{nd}$ line, the $5^{th}$ line, the $8^{th}$ line and the $11^{th}$ line contain more R, B than G. Thus in cases in which an image capture mode is selected to capture a subject with a lot of R, B, the controller 24 instructs the drive section 22 to output line image data to the image capture processing section 16 at vertical direction 1/3 thinning, starting from the $2^{nd}$ line. This thereby enables the resolution sensitivity to be raised in cases in which image capture is made of a subject with a lot of R, B. Moreover, it also enables the S/N ratio of the image to be raised in cases in which image capture is made of a subject with extremely small amounts of R, B.

Moreover, as illustrated in FIG. 9, the line image data of the 1st line, the 4th line, the 7th line and the 10th line contains more G than R, B. Thus in cases in which an image capture mode is selected to capture a subject with a lot of G, the controller 24 instructs the drive section 22 to output line image data to the image capture processing section 16 at vertical direction 1/3 thinning, starting from the 1st line. This thereby enables the S/N ratio of the image to be raised in cases in which there is a lot of G in the subject.

Moreover, as illustrated in FIG. 9, there is about the same proportion for each of R, B, and G in the line image data of the 2nd line, the 4th line, the 7th line and the 11th line. Thus in cases in which an image capture mode is selected to capture a subject including a lot of black and white components, the controller 24 instructs the drive section 22 to output line image data to the image capture processing section 16 in a sequence of the 2nd line, the 4th line, the 7th line, and the 11th line, and so on. This thereby enables the S/N ratio of the image to be raised in cases in which image capture is made of a subject with a lot of black and white components.

Figure 10:
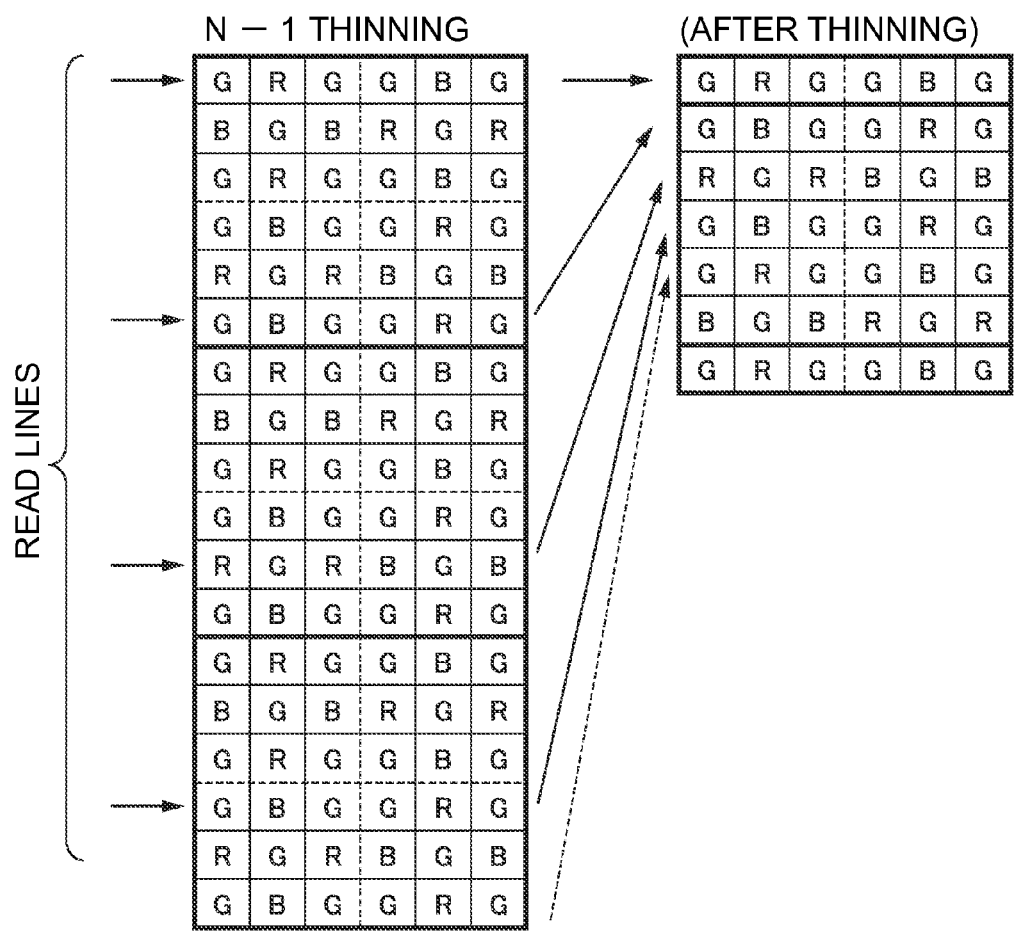
FIG. 10 is an explanatory diagram regarding switching lines to be read according to the third exemplary embodiment.

Moreover, for an image capture mode that demands a comparatively high image resolution, configuration may be made such that the controller 24 instructs the drive section 22 to output the line image data to the image capture processing section 16 running along the horizontal direction at a (N+k) line cycle (wherein 0<k<N) in the vertical direction, as illustrated in FIG. 10. FIG. 10 illustrates a case in which N=6, k=1, such that line image data is read at a 5 line cycle in the vertical direction. In such cases, as illustrated in FIG. 10, the image after thinning is also an image in which the basic array pattern P is repeated. This thereby enables the processing to be applied to the image data after thinning to be common to the image processing of non-thinned image data, such as in still image capture.

Moreover, as described above, configuration may be made such that switching according to the image capture mode is enabled for cases driven such that line image data running along the horizontal direction is read at a (N+k) line cycle (wherein 0<k<N) in the vertical direction, and for cases driven such that line image data running along the horizontal direction is read at a (N+k) line cycle (wherein 0<k<N), such as at a (N) line cycle in the vertical direction as explained for the first exemplary embodiment for example (the controller 24 corresponds to the switching means).

Thus the present exemplary embodiment enables switching of the lines to be read, namely enables the thinning method to be switched, according to the image capture mode. This thereby enables the resolution and the SIN ratio of images to be appropriately controlled according to the image capture mode, and also enables Automatic White Balance (AWB) control and Automatic Exposure (AE) control to be appropriately set according to the image capture mode.

Moreover, as stated above, in a color filter with a conventional Bayer array, in cases in which one line's worth of image data has been read for each of an even number of lines in the vertical direction (for example vertical direction 1/2 thinning), this results in line image data being read that only contains two colors, G and R, or G and B, and so one line's worth of image data needs to be read every odd number of lines in the vertical direction.

In contrast thereto, in the color filter of the present exemplary embodiment, it is possible to read one line's worth of image data for each of an even number of lines in the vertical direction, and also possible to read one line's worth of image data for every odd number of lines in the vertical direction, Thus, being able to read image data of whichever lines in the vertical direction, thereby enables various resolutions and frame rates to be accommodated. For example, depending on the image capture mode, the resolution is lowered in cases in which priority is desired for high frame rates, and the frame rate is lowered in cases in which the priority is for high resolution, thereby enabling various image capture modes to be accommodated.

Moreover, configuration may be made such that the lines to be read are switched according to the motion of the subject. For example, in cases in which the imaging apparatus is operated by panning, a movement amount of the subject is detected by employing subject data (for example inter-frame data) or by employing an external sensor, such as a gyro sensor.

The resolution and frame rate are then set according to the amount of movement of the subject, and then image data is read with a thinning method corresponding to the set resolution and frame rate. This thereby enables an optimum balance to be obtained between delay in motion of the subject and resolution.

Note that the color filter is not limited to those described in each of the exemplary embodiments, and the present invention may also be applied to an imaging apparatus having an image pickup device with the following color filter array.

Figure 11:
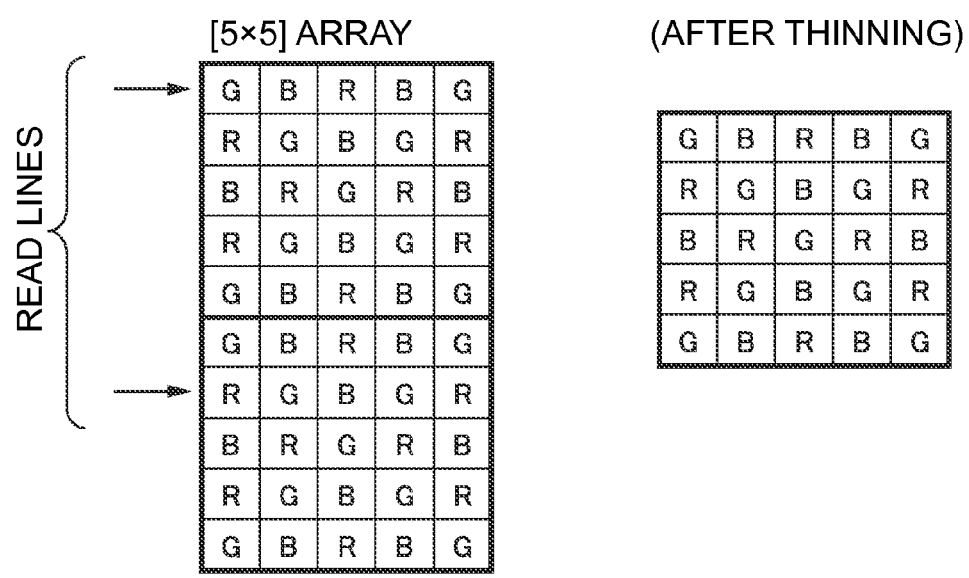
FIG. 11 is a diagram of a modified example of a color filter.

For example, as a color filter array having the above features (1), (2), (3), (4) and (5), there is a color filter array in which a basic array pattern P is the 5×5 pixel color filter array, as illustrated in FIG. 11. This color filter array is configured by a repeating basic array pattern set with G placed along the two diagonal directions in the 5×5 pixels, and with R, B pixels placed on the remaining pixel positions such that there is 1 or more of each placed in each of the horizontal direction and vertical direction lines in the 5×5 pixels, set such the number of G is greater than the number of R and the number of B. For these color filters, in cases in which line image data is read at a (N+1) line cycle in the vertical direction as illustrated in FIG. 11, the image after thinning becomes an image that includes an image in which the basic array pattern repeats.

Figure 12:
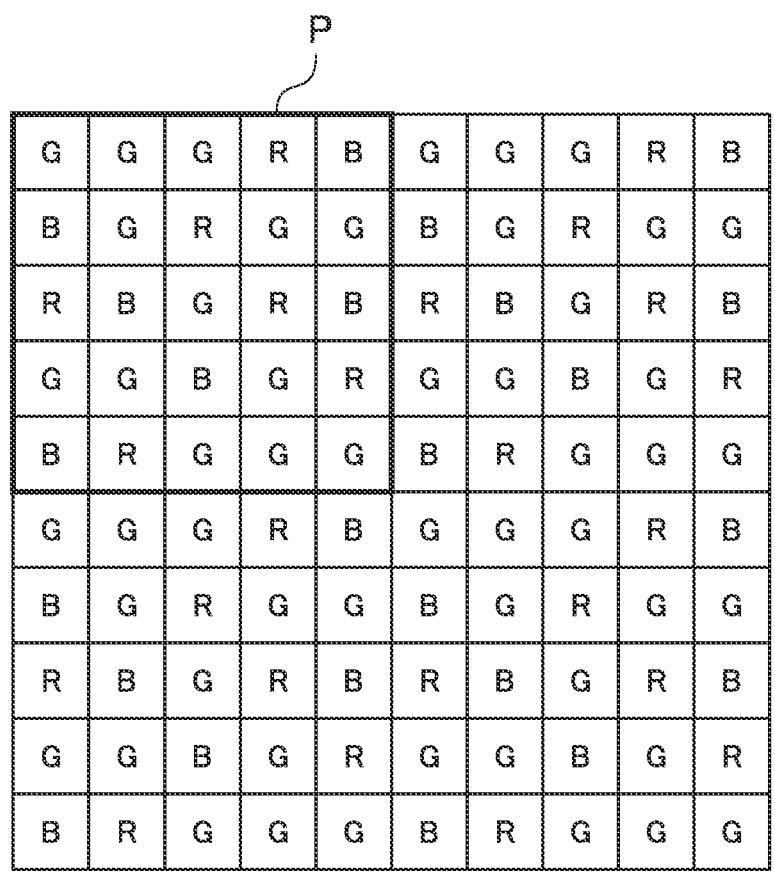
FIG. 12 is a diagram of a modified example of a color filter.
Figure 13:
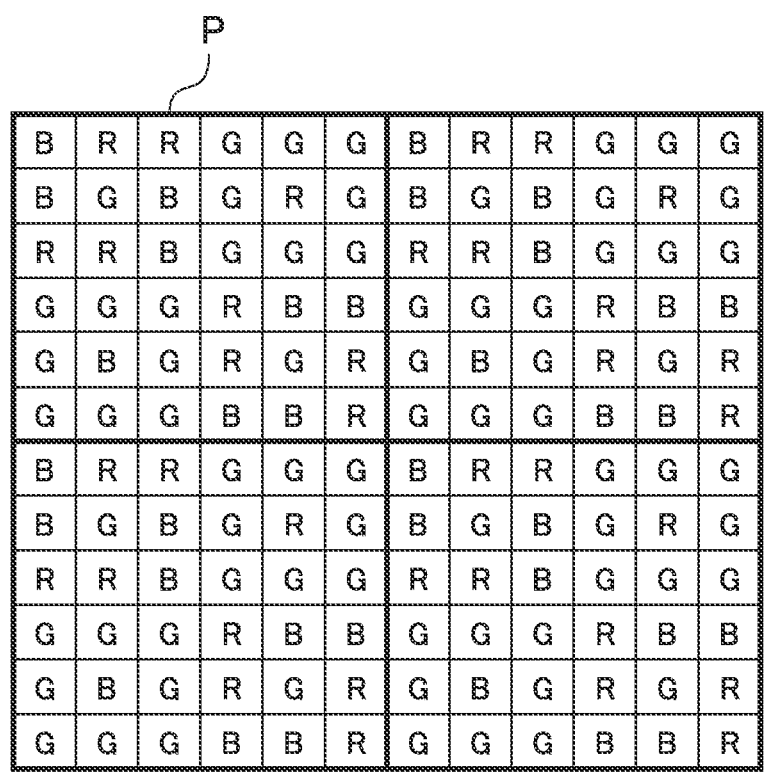
FIG. 13 is a diagram of a modified example of a color filter.
Figure 14:
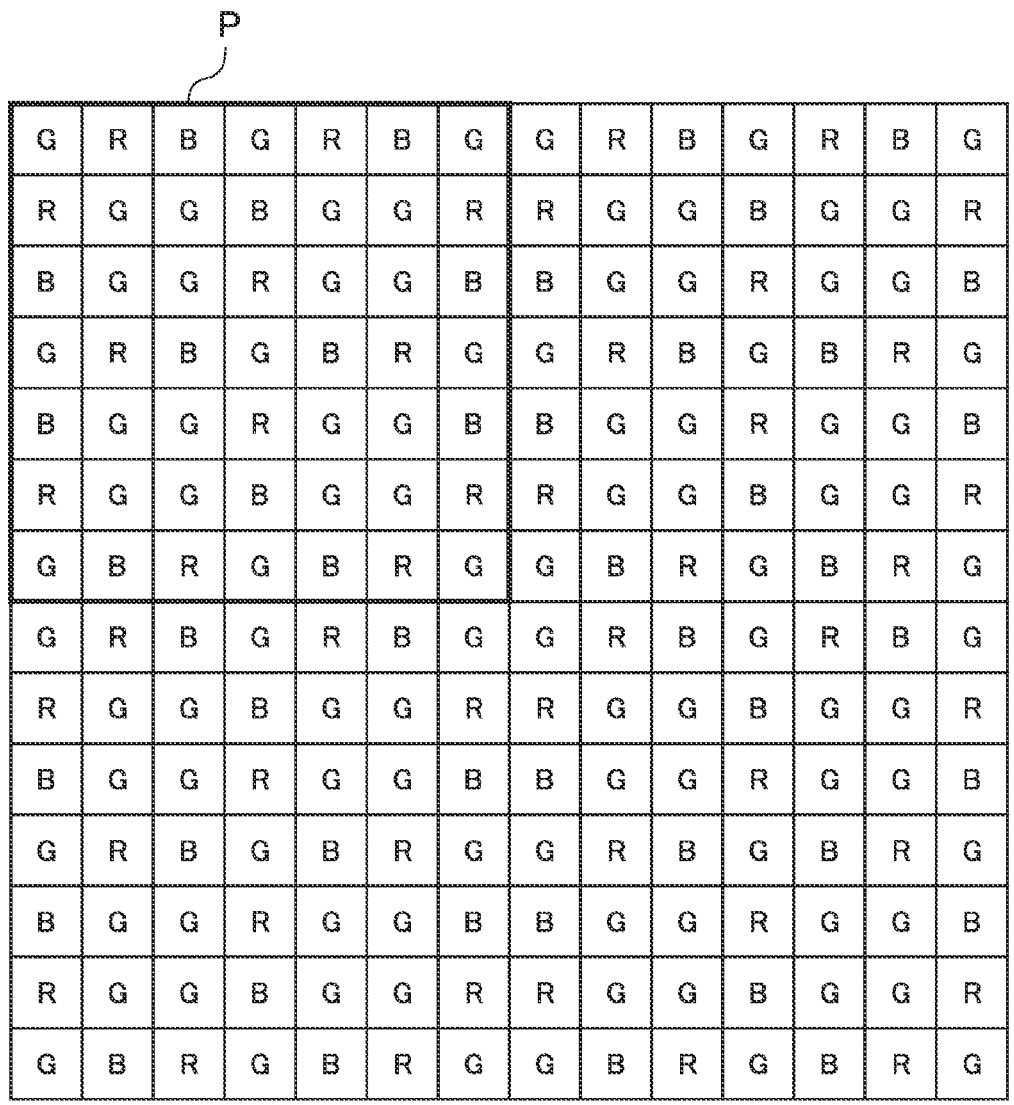
FIG. 14 is a diagram of a modified example of a color filter.
Figure 15:
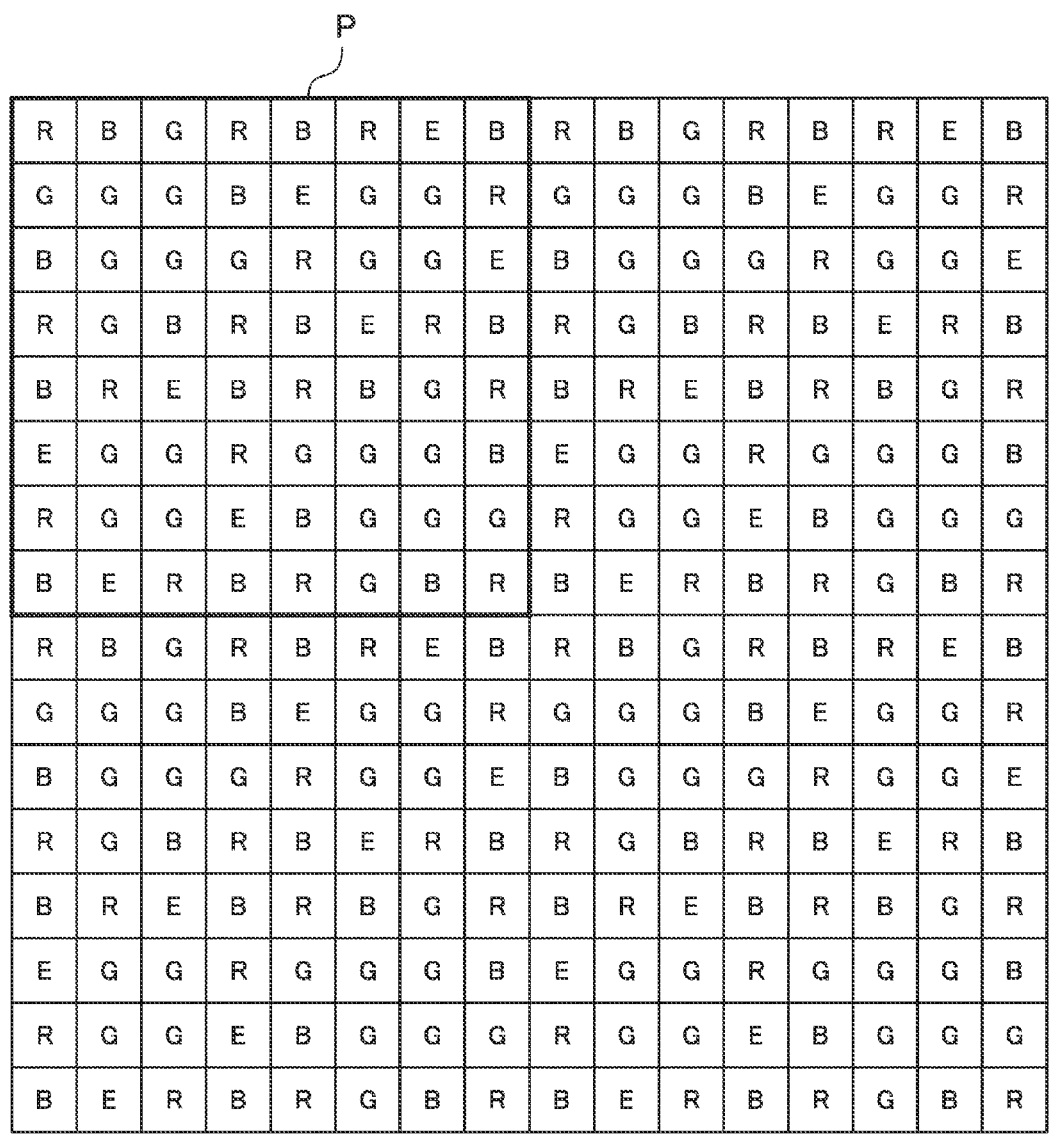
FIG. 15 is a diagram of a modified example of a color filter.

Similarly, as a color filter array having the above features (1), (2), and (3), there is a color filter array of 5×5 pixels of a basic array pattern P such as that illustrated in FIG. 12, Moreover, there is, as illustrated in FIG. 13 a color filter array in which the basic array pattern P has 6×6 pixels. This color filter array is configured by a repeating basic array pattern including a first sub array with G placed in a rectangular shape at the external perimeter of an R or B, and a second sub array in which G is placed at a center portion, with two of each of the sub arrays alternately disposed so as to be adjacent to each other along the horizontal direction and the vertical direction, Such an array is feature (3) with the additional characteristic of 1 or more of each of R and B being placed in each line in the diagonal (NE, NW) directions (third directions) of the color filter array. Moreover, there is, as illustrated in FIG. 14 a color filter array in which the basic array pattern P has 7×7 pixels, and, as illustrated in FIG. 15, a color filter array in which the basic array pattern P has 8×8 pixels, and so on.

Note that in consideration of the case of image processing, such as synchronization processing or thinning processing during video image capture, preferably N, M are each 10 or lower.

Moreover, although explanation has been given in the above exemplary embodiment of a case in which there is a color image pickup device having 3 primary color filters, RGB, the present invention is not limited thereto, and application may be made to a color filter having 4 colors of the three primary colors RGB+one other color (for example, emerald (E)), such as for example the color filter illustrated in FIG. 16. Moreover, the present invention may be applied to a color filter having a white or transparent (W) filter as the other color. For example, a W filter may be placed instead of the emerald of FIG. 16. In such cases, a combination of W and G, or W is the first color that contributes most to the brightness signal.

Moreover, the present invention may be applied to a color image pickup device including a color filter with a complementary color system of 4 colors with, in addition to G, C (cyan), M (magenta) and Y (yellow), that are the complementary colors of the primary colors RGB.

Moreover, in each of the above exemplary embodiments, explanation has been given of cases in which line image data running along the horizontal direction are read at a predetermined cycle in the vertical direction, however the present invention is also applicable to cases in which the line image data running along the vertical direction are read at a predetermined cycle in the horizontal direction.

Moreover, in the first exemplary embodiment described earlier, explanation was given regarding a case in which line image data of lines running along the horizontal direction are read at a (N+1) line cycle in the vertical direction from the image pickup device 14. However, there is no limitation thereto, and configuration may be made such that reading is performed at a cycle other than a (N+1) cycle in the vertical direction.

Figure 17:
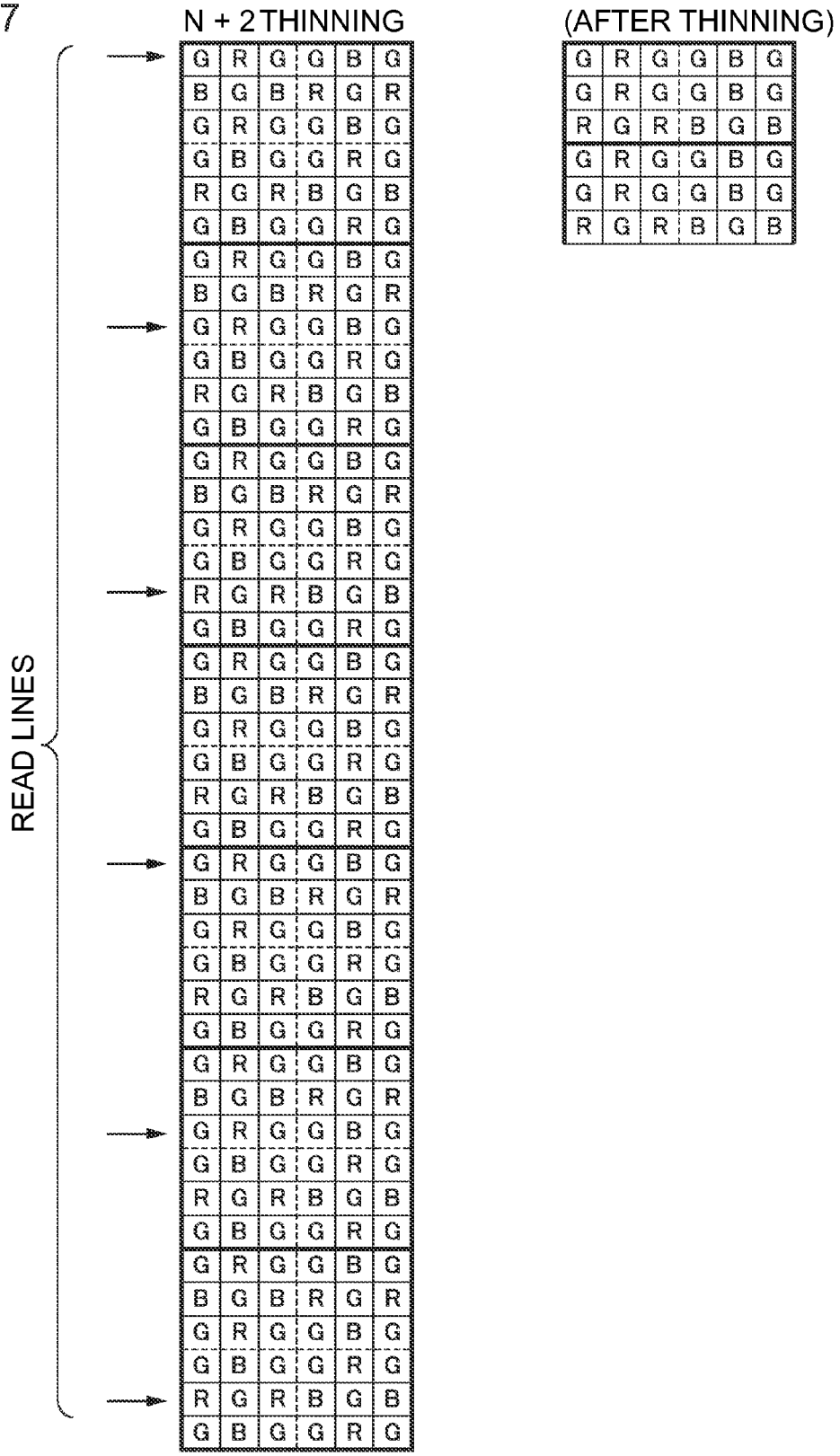
FIG. 17 is an explanatory diagram regarding an image in a case in which one line's worth of image data is read for each (N+2) lines.
Figure 18:
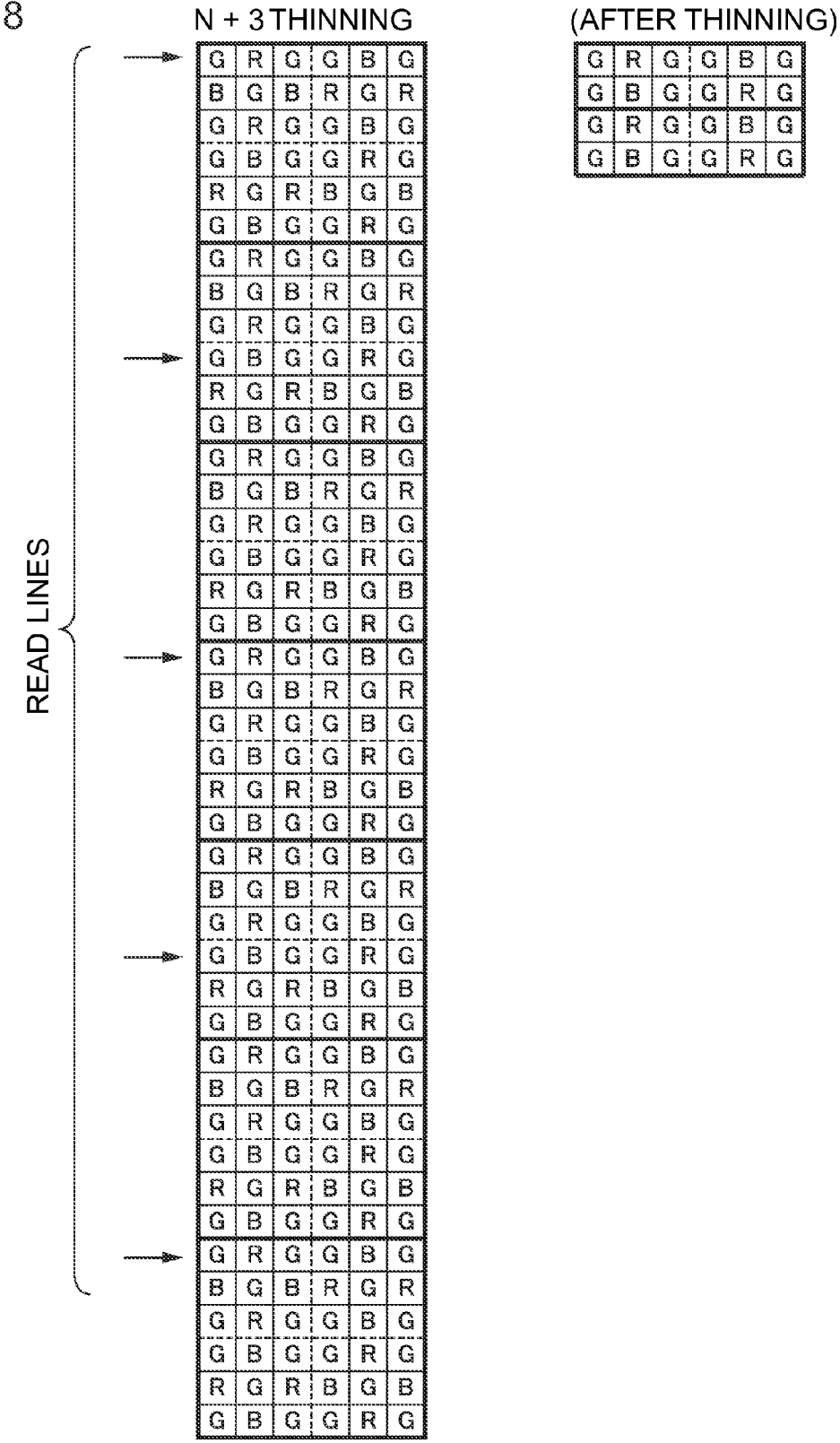
FIG. 18 is an explanatory diagram regarding an image in a case in which one line's worth of image data is read for each (N+3) lines.
Figure 19:
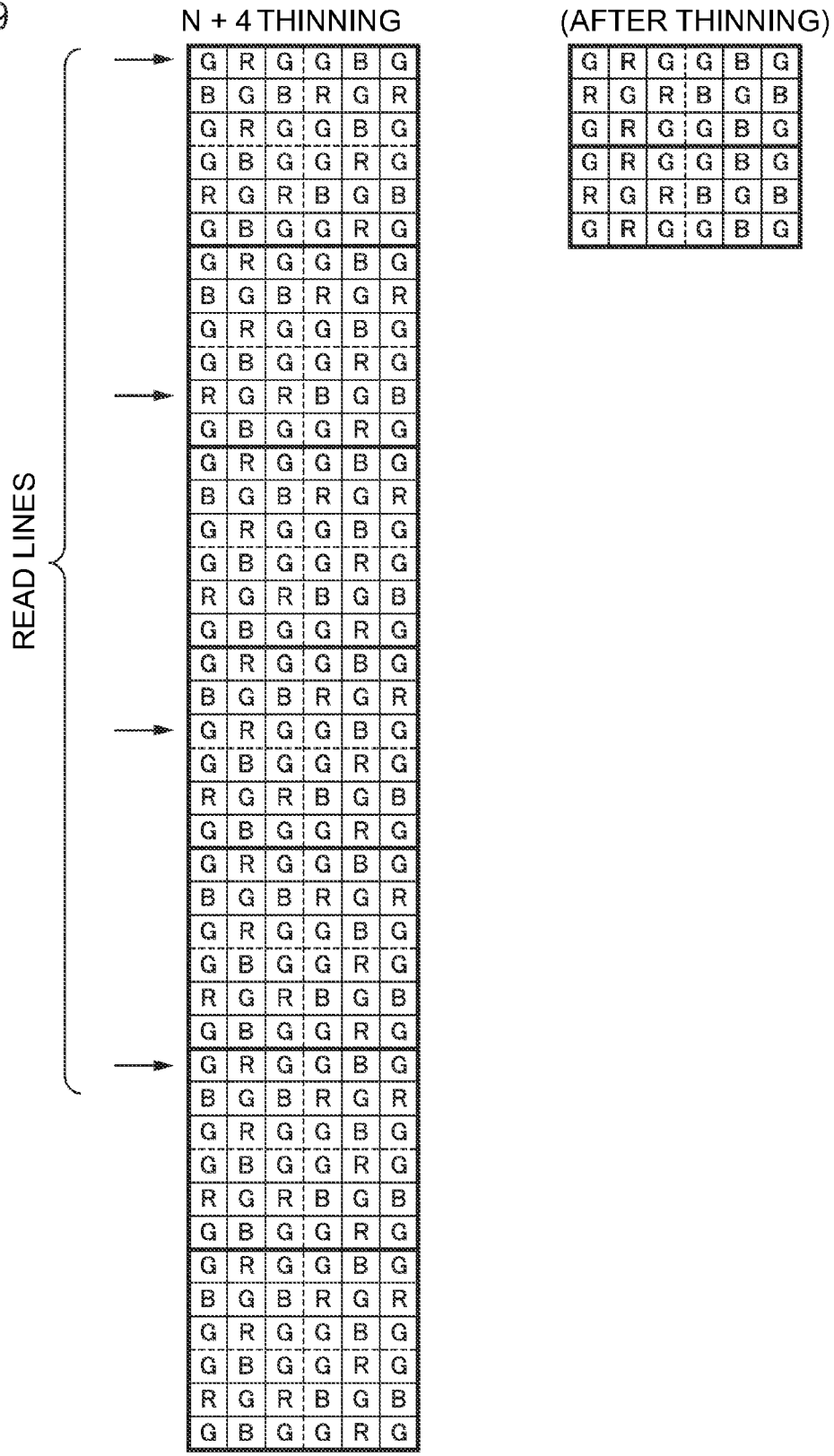
FIG. 19 is an explanatory diagram regarding an image in a case in which one line's worth of image data is read for each (N+4) lines.

For example, in cases in which the color filter with the 6×6 pixel basic array pattern of FIG. 2 is used, configuration may be made such that line image data of lines running along the horizontal direction arc read from the image pickup device 14 at a (N+2) line cycle in the vertical direction, as illustrated in FIG. 17. Moreover, in cases in which the color filter with the 6×6 pixel basic array pattern of FIG. 2 is used, configuration may be made such that line image data of lines running along the horizontal direction arc read from the image pickup device 14 at a (N+3) line cycle in the vertical direction, as illustrated in FIG. 18. In cases in which the color filter with the 6×6 pixel basic array pattern of FIG. 2 is used, configuration may be made such that line image data of lines running along the horizontal direction are read from the image pickup device 11 at a (N+4) cycle in the vertical direction, as illustrated in FIG. 19. Moreover, in cases in which the color filter with the 6×6 pixel basic array pattern of FIG. 2 is used, configuration may be made such that line image data of lines running along the horizontal direction is read from the image pickup device 14 at a (N+5) line cycle in the vertical direction, as illustrated in FIG. 20.

Moreover, in the present exemplary embodiment, explanation has been given of cases in which the pixel signals of pixels in lines running along the horizontal direction are read from the image pickup device 14 at a (N+k) line cycle in the vertical direction to generate line image data, and image data is generated based on this line image data. However, configuration may be made such that pixel signals in all lines' worth of pixels are read, and then line image data of lines at a (N+k) line cycle are selectively employed (by not using, or by not storing, line image data of other lines) to generate image data. Moreover, pixel signals in all lines worth of pixels may be read and temporarily stored, in memory such as RAM, and then line image data of lines at a (N+k) line cycle selectively employed to generate image data (in this embodiment, the image capture processing section 16 or the image processing section 20 corresponds to the line image data generation means).

It goes without saying that the present invention is not limited by the exemplary embodiments that are described above, and various other modifications may be implemented within a range not departing from the spirit of the present invention.

What is claimed is:

1. An imaging apparatus comprising:
an image pickup device comprising a plurality of photoelectric conversion elements arrayed in a predetermined first direction and a second direction intersecting with the first direction;
a color filter unit that is provided above a plurality of pixels configured by the plurality of photoelectric conversion elements, the color filter unit having a repeatedly disposed basic array pattern wherein a first filter corresponding to a first color that contributes most to obtaining a brightness signal, and second filters respectively corresponding to 2 or more second colors other than the first color, are placed in a predetermined pattern of (N×M) pixels in the first direction and the second direction wherein N and M are integers of 3 or more, with one or more of the first filter and the second filters corresponding to each of the second colors respectively placed in each line in the color filter unit in the first direction and the second direction, and with one or more of the first filter placed in each line in the color filter plane in the first direction, the second direction and third directions that intersect with the first direction and the second direction;
- a line image data generator configured to read pixel signals from a plurality of pixels at a set cycle from the image pickup device, and, from the read pixel signals, generates line image data configured from pixel signals of pixels that are arrayed running along the second direction and are arrayed at an (N+k) line cycle in the first direction, wherein k is a positive integer such that 0<k <N, from out of the plurality of pixels;
- an image data generator configured to generate image data based on the line image data; and
- a pixel mixer that respectively mixes pixels that are the same color pixels as each other from the line image data configured from the pixel signals of the pixels that are arrayed running along the second direction and are arrayed at the (N+k) line cycle in the first direction, and from line image data configured from pixel signals of pixels that are arrayed running along the second direction and are arrayed at an N line cycle in the first direction away from the (N+k) line image data.

2. The imaging apparatus of claim 1, wherein the line image data generator generates line image data configured from pixel signals of pixels that are arrayed running along the second direction and are arrayed at an (N+k) line cycle in the first direction such that at least one of the first color and each of the second colors of the two or more colors are respectively contained in each of the lines running along the first direction.

3. The imaging apparatus of claim 2, wherein the line image data generator generates line image data configured from pixel signals of pixels that are arrayed running along the second direction and are arrayed, as the set cycle, at an (N+1) line cycle in the first direction.

4. The imaging apparatus of claim 1, further comprising:
- a switch that switches between a first generation method that generates line image data configured from pixel signals of pixels that are arrayed running along the second direction and are arrayed at an (N+k) line cycle in the first direction (wherein 0<k <N), and a second generation method that generates line image data configured from pixel signals of pixels that are arrayed running along the second direction and are arrayed at an (N−k) line cycle in the first direction.

5. The imaging apparatus of claim 1, wherein:
the color filter unit includes a square array corresponding to 2×2 pixels configured from the first filter.

6. The imaging apparatus of claim 1, wherein:
the first color is green (G), and the second colors are red (R) and blue (B).

7. The imaging apparatus of claim 6, wherein:
the color filter unit includes an R filter, a G filter, and a B filter corresponding to colors red (R), green (G) and blue (B); and
the color filter unit is configured by a first array and a second array alternately arrayed in the first direction and the second direction, wherein the first array corresponds to 3×3 pixels with the G filter placed at the center and the 4 corners, the B filter placed at the top and bottom of the central G filter, and the R filter placed at the left and right of the central G filter, and the second array corresponds to 3×3 pixels with the G filter placed at the center and the 4 corners, the R filter placed at the top and bottom of the central G filter, and the B filter placed at the left and right of the central G filter.

8. A control method for an imaging apparatus comprising an image pickup device including a plurality of photoelectric conversion elements arrayed in a predetermined first direction and a second direction intersecting with the first direction, and a color filter unit that is provided above a plurality of pixels configured by the plurality of photoelectric conversion elements, the color filter unit having a repeatedly disposed basic array pattern wherein a first filter corresponding to a first color that contributes most to obtaining a brightness signal, and second filters respectively corresponding to 2 or more second colors other than the first color, are placed in a predetermined pattern of (N×M) pixels in the first direction and the second direction, wherein N and M are integers of 3 or more, with one or more of the first filter and the second filters corresponding to each of the second colors respectively placed in each line in the color filter unit in the first direction and the second direction, and with one or more of the first filter placed in each line in the color filter plane in the first direction, the second direction, and third directions that intersect with the first direction and the second direction, the control method comprising:
- reading pixel signals from the plurality of pixels at a set cycle from the image pickup device;
- generating, from the read pixel signals, line image data configured from pixel signals of pixels that are arrayed running along the second direction and are arrayed at an (N+k) line cycle in the first direction, wherein k is a positive integer such that 0<k <N, from out of the plurality of pixels;
- generating image data based on the line image data; and
- mixing pixels that are the same color pixels as each other from the line image data configured from the pixel signals of the pixels that are arrayed running along the second direction and are arrayed at the (N+k) line cycle in the first direction, and from line image data configured from pixel signals of pixels that are arrayed running along the second direction and are arrayed at an N line cycle in the first direction away from the (N+k) line image data.

9. A non-transitory storage medium storing a control program that causes processing to be executed by a computer that controls an imaging apparatus comprising an image pickup device including a plurality of photoelectric conversion elements arrayed in a predetermined first direction and a second direction intersecting with the first direction, and a color filter that is provided above a plurality of pixels configured by the plurality of photoelectric conversion elements, the color filter unit having a repeatedly disposed basic array pattern wherein a first filter corresponding to a first color that contributes most to obtaining a brightness signal, and second filters respectively corresponding to 2 or more second colors other than the first color, are placed in a predetermined pattern of (N×M) pixels in the first direction and the second direction, wherein N and M are integers of 3 or more, with one or more of the first filter and the second filters corresponding to each of the second colors respectively placed in each line in the color filter in the first direction and the second direction, and with one or more of the first filter placed in each line in the color filter plane in the first direction, the second direction and third directions that intersect with the first direction and the second direction, the processing comprising:

a step of reading pixel signals from the plurality of pixels at a set cycle from the image pickup device;

a step of generating, from the read pixel signals, line image data configured from pixel signals of pixels that are arrayed running along the second direction and are arrayed at an (N+k) line cycle in the first direction, wherein k is a positive integer such that 0<k <N, from out of the plurality of pixels;

a step of generating image data based on the line image data; and a step of mixing pixels that are the same color pixels as each other from the line image data configured from the pixel signals of the pixels that are arrayed running along the second direction and are arrayed at the (N+k) line cycle in the first direction, and from line image data configured from pixel signals of pixels that are arrayed running along the second direction and are arrayed at an N line cycle in the first direction away from the (N+k) line image data.

10. A non-transitory storage medium storing a control program that causes processing to be executed by a computer, the processing comprising:

a step of generating line image data from pixel signals of pixel signals in a plurality of pixels read at a set cycle from an image pickup device including a plurality of photoelectric conversion elements arrayed in a predetermined first direction and a second direction intersecting with the first direction, and a color filter unit that is provided above a plurality of pixels configured by the plurality of photoelectric conversion elements, the color filter unit having a repeatedly disposed basic array pattern wherein a first filter corresponding to a first color that contributes most to obtaining a brightness signal, and second filters respectively corresponding to 2 or more second colors other than the first color, are placed in a predetermined pattern of (N×M) pixels in the first direction and the second direction, wherein N and M are integers of 3 or more, with one or more of the first filter and the second filters corresponding to each of the second colors respectively placed in each line in the color filter in the first direction and the second direction, and with one or more of the first filter placed in each line in the color filter plane in the first direction, the second direction and third directions that intersect with the second direction, with the line image data configured from pixel signals of pixels that are arrayed running along the second direction and are arrayed at an (N+k) line cycle in the first direction, wherein k is a positive integer such that 0<k <N, from out of the plurality of pixels;

a step of generating image data based on the line image data; and a step of mixing pixels that are the same color pixels as each other from the line image data configured from the pixel signals of the pixels that are arrayed running along the second direction and are arrayed at the (N+k) line cycle in the first direction, and from line image data configured from pixel signals of pixels that are arrayed running along the second direction and are arrayed at an N line cycle in the first direction away from the (N+k) line image data.

* * * * *